United States Patent [19]

Falconer

[11] Patent Number: 4,521,745
[45] Date of Patent: Jun. 4, 1985

[54] INTERACTIVE NON-HIERARCHICAL ADAPTIVELY SYNCHRONIZED OSCILLATOR NETWORK AND PHASE LOCKED LOOP OSCILLATOR FOR USE THEREIN

[75] Inventor: Robert M. Falconer, Ipswich, England

[73] Assignee: British Telecommunications, England

[21] Appl. No.: 384,475

[22] Filed: Jun. 3, 1982

[30] Foreign Application Priority Data

Jun. 8, 1981 [GB] United Kingdom ............... 8117487

[51] Int. Cl.³ .............................................. H03L 7/00
[52] U.S. Cl. ........................................ 331/2; 331/25; 331/49; 375/120; 455/260
[58] Field of Search ..................... 331/1 A, 2, 15, 16, 331/18, 25, 27, 49; 375/120; 455/260

[56] References Cited

U.S. PATENT DOCUMENTS

| | | | |
|---|---|---|---|
| 2,770,730 | 11/1956 | Urtel | 250/36 |
| 3,662,277 | 5/1972 | White | 343/100 ST |
| 3,769,607 | 10/1973 | Thelen | 331/2 |
| 3,859,466 | 1/1975 | Hartmann | 179/15 BS |
| 3,942,115 | 3/1976 | Wolejsza, Jr. | 331/2 |
| 4,282,493 | 8/1981 | Moreau | 331/49 X |
| 4,297,649 | 10/1981 | Sbuelz et al. | 331/49 X |
| 4,336,505 | 6/1982 | Meyer | 331/25 X |
| 4,420,723 | 12/1983 | de Jager | 331/2 X |

FOREIGN PATENT DOCUMENTS

| | | |
|---|---|---|
| 2938043 | 4/1981 | Fed. Rep. of Germany . |
| 0903984 | 8/1962 | United Kingdom . |

OTHER PUBLICATIONS

Colloque International de Communication, May 7-11, 1979, Paris (FR) U. de Julio et al: "Objectifs de Synchronisation du Reseau National", pp. 559-566, * p. 560, right-hand column, line 1-p. 562, right-hand column, line 21, FIGS. 3, 4.

Gersho and Karafin in Bell Systems Technical Journal, Dec. 1966, pp. 1689-1705.

Proc IEEE, vol. 66, No. 10, Oct. 1978, by Hopkins et al, pp. 1225-1231-1232.

Primary Examiner—Eugene R. LaRoche
Assistant Examiner—Robert J. Pascal
Attorney, Agent, or Firm—Cushman, Darby & Cushman

[57] ABSTRACT

A system for synchronizing remote or colocated oscillators is constructed with redundancy enabling a high degree of fault toleration. In the various embodiments of the system there is no predetermined hierarchy amongst the oscillators in contrast to the prior art master and slave type of synchronization. Averaging is not involved and the system settles to a state in which the oscillators are locked to one master, which is not predetermined. Each oscillator is part of a terminal which includes reconfiguration circuitry, and each, in the absence of faults, is connected to each of the other terminals. The terminals attempt to lock to another oscillator and reconfigure in accordance with an algorithm until stable synchronization is achieved. In one embodiment the properties of a phaselocked loop are utilized in a novel way by incorporating a variable delay in its feed back path. Using this circuitry enables one embodiment to achieve synchronization even when only indirect paths exist to the assumed master, and in the system temporary disconnection for reconfiguration is not necessary.

11 Claims, 13 Drawing Figures

INTERACTIVE NON-HIERARCHICAL ADAPTIVELY SYNCHRONIZED OSCILLATOR NETWORK AND PHASE LOCKED LOOP OSCILLATOR FOR USE THEREIN

This invention relates to electrical oscillators and in particular to the synchronized of a number of electrical oscillators, and in a further aspect to phase-locked loops containing oscillators.

Most systems in which oscillators are required to be synchronized are in one of two categories. In the first category the oscillators are remote from one another and each performs a unique non-redundant function. Such a synchronized system exists in some navigation aids. In the other type of system the oscillators are located in close proximity and the plurality of oscillators is provided for reliability enhancement.

The present invention may find application in either type of system.

A method of synchronization for either type of system is to nominate one oscillator as the master and to phase-lock the remainder to it as slaves. While the method is satisfactory in many applications it nevertheless suffers from the disadvantage that synchronism between the slave oscillators depends on the continuing operation of the master.

This disadvantage is most often a serious consideration in the second type of system mentioned above, since, if the desired reliability enhancement is to be achieved, some provision must be made to keep the remaining oscillators locked together if the master oscillator fails. This disadvantage may for example appear in automatic telephone exchanges where the oscillators are included as a source of clocking signals. One procedure for dealing with failure of the master oscillator that has been proposed is to use a hierarchical arrangement of masters and slaves; the first slave in the hierarchy taking control if the master fails. To implement this technique fault detection and changeover mechanisms are required, and the reliability of such mechanisms is crucial to the operation of the system.

Such an hierarchical arrangement is described in U.S. Pat. No. 3,942,115 in the context of a satellite communications system.

Another control scheme for synchronizing the frequencies of geographically separate oscillators connected by communication links comprises the steps of averaging the phases received at each station from remote oscillators, comparing the result with the local phase, and applying the filtered error signal as a correction to the local oscillator. This technique is known as "mutual synchronization", and is described, for example, by Gersho and Karafin in Bell Systems Technical Journal, December 1966, pp 1689-1705.

Another method of synchronization with some similarities to the mutual synchronization scheme is referred to as 'majority voting'. Such a system is described by Hopkins et al in Proc IEEE Vol 66 No. 10, October 1978, pp 1225 and 1231-1232. Control circuitry for an oscillator monitors the output from three other oscillators and all four are phase locked together. If one differs the control circuitry takes the majority signal of the other two and phase locks to that.

The present invention provides a system for synchronizing oscillators in which like the master and slave systems relies on each oscillator synchronizing to one another. There is however no master oscillator predetermined by the configuration and no hierarchy built into the configuration of the system. There is also no phase averaging or majority voting. Each oscillator in the system synchronizes itself to one other, chosen at random from available inputs. Each oscillator receives inputs from the other oscillators and is controlled such that it repeatedly attempts to synchronize with another oscillator until the system as a whole is synchronized.

A very limited non-hierarchical synchronization system is described in the specification for U.S. Pat. No. 3,662,277.

Figure 1:
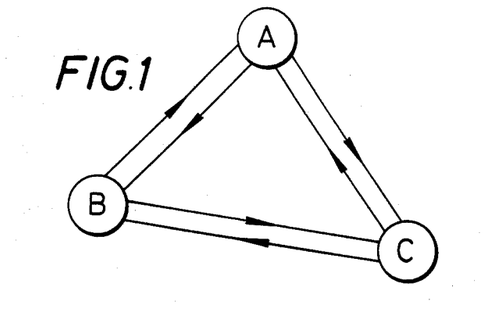
FIG. 1 shows diagrammatically a system containing three oscillators illustrating the operation of a known system.

FIG. 1 of the accompanying drawings illustrates schematically the basis of the system in U.S. Pat. No. 3,662,277 and in a fault-free state each oscillator and its control circuitry is connected by an incoming and outgoing path to each of the others.

Figure 2:
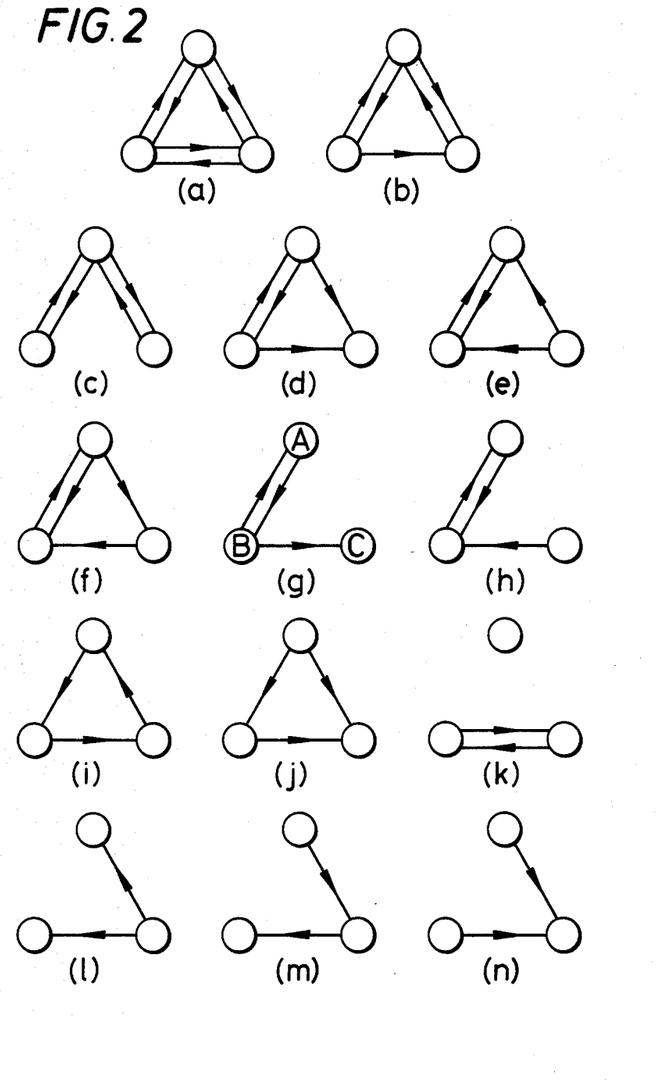

FIG. 2 shows diagrammatically the possible combination of paths between the terminals A, B and C when fault conditions occur. A fault may result from a single or multiple failure of the paths. In FIG. 2(a) there are no fault conditions, all paths are available, and all terminals can synchronized.

FIG. 2(b) shows the case where one path is unavailable and there are six combinations of this condition, and again all terminals can synchronized as is readily apparent.

FIGS. 2(c) to (f) show the four different arrangements that can occur when two paths are unavailable. In the case of the arrangements shown in (c), (d) and (e) there are three combinations of each of these arrangements. In the arrangement shown in FIG. 2(f) there are six combinations. In each of these, all terminals may still synchronized. When only three paths are available, as shown in FIGS. 2(g) to (j), whether or not the terminals can synchronized depends on the particular configuration of the available paths. FIG. (j) of which there are six combinations is an arrangement where synchronization can occur, whereas in FIG. (h) (six combinations) and in FIG. (i) (two combinations) it is not possible for the terminals to synchronize. In FIG. (g) (six combinations) all the terminals can synchronize providing B is the master so that A locks to B; whereas if B is locked to A, C becomes isolated and therefore all three terminals cannot synchronize. In the final case where four paths are unavailable, the four possibilities are shown in 2(k) to (n) and in only one, 2(l) is synchronization possible.

This system is characterized by being able to synchronize if and only if a direct path remains intact between one oscillator, which becomes the master, and each of the others which become the slaves.

The present invention seeks to provide a more fault tolerant system than the system illustrated in FIG. 2.

Figure 13:
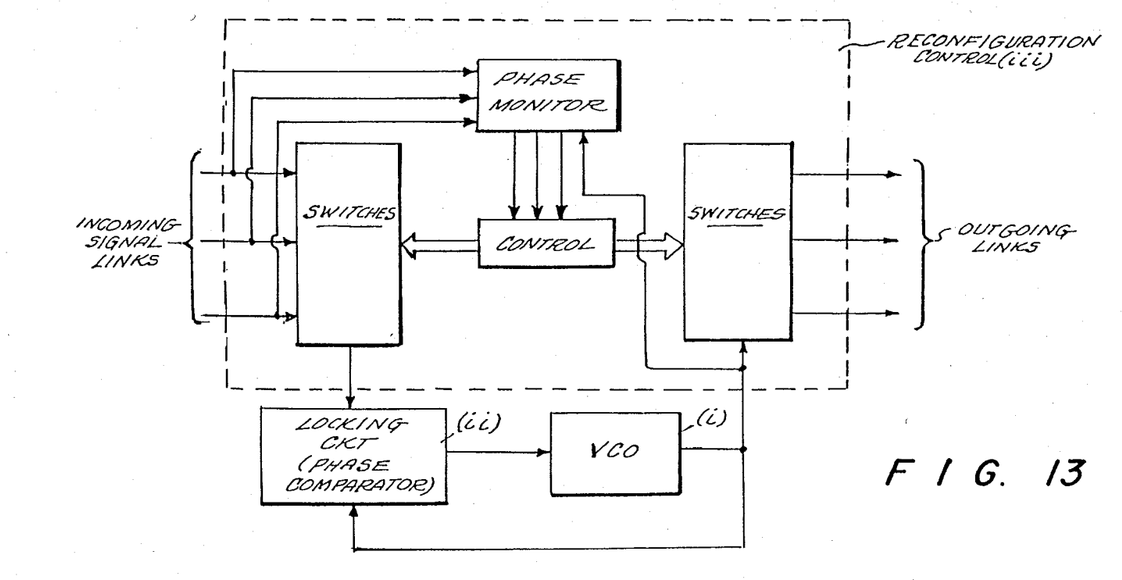
FIG. 13 is a block diagram of the reconfiguration control hardware.

In the following description of the invention and examples of its embodiments reference will be made to terminals. A terminal is herein defined as containing:

(i) an oscillator whose frequency can be controlled, (ii) a locking circuit capable of synchronizing the oscillator with an incoming signal frequency, (iii) reconfiguration control means, see FIG. 13, which monitors at least the incoming signals to the terminal, and on the basis of those signals can connect the locking circuit to any one of the number of input signals. The reconfiguration control means may also in some cases be capable of disconnecting the oscillator from its outgoing links.

Reference will also be made to a path between two terminals which is defined as the serial connection of:

(a) an operating oscillator;

(b) an intact link (i.e. the physical connection between the terminals including any buffers or filters);

(c) an operating reconfiguration control capable of connecting to, or a permanent connection to, the signal received from said link;

(d) a functioning locking circuit.

Failure of a path will result from failure of any one of the above. In the case of reconfiguration control failure such that it is permanently connected to said link does not constitute failure of the path.

According to the present invention in a first aspect there is provided a network of three or more interconnected terminals, each terminal comprising:

a controlled-frequency oscillator, a locking circuit operative to synchronize the frequency of the oscillator with the frequency of an incoming signal to the terminal, and reconfiguration control means operative to monitor the incoming signals to the terminal and to connect the locking circuit to any one of the incoming signals, and to connect or disconnect the local oscillator to or from the outgoing links from the terminal;

the terminals being interconnected such that each is linked to the output of at least one of the other terminals in the network to receive output signals from the respective oscillators in those terminals;

characterized in that:

the reconfiguration control means in each terminal monitors and receives incoming signals and compares the phase of each with that of its local oscillator, when said comparison detects an out-of-phase incoming signal the reconfiguration control means disconnects its oscillator from its outgoing links and connects the locking circuit to one of the incoming signals, when said comparison does not detect an out-of-phase incoming signal the reconfiguration control means connects its oscillator to its outgoing links, and the reconfiguration control means is further operative to detect whether its oscillator has locked to an incoming signal to which it has been connected, and (i) if so, to connect its oscillator to its outgoing links, but if there remains another out-of-phase incoming signal, to connect its locking circuit to the other incoming signal, (ii) if it has not locked, to connect its locking circuit to any other incoming signal, until all other signals have been connected without locking, and then to reconnect its oscillator to its outgoing links, so that the plurality of terminals tend towards stable sychronization provided that a forward path exists directly or indirectly from any one terminal, which then becomes the master, to the remaining terminals, which then become the slaves.

According to the invention in a second aspect there is provided a network of three or more interconnected terminals, each terminal comprising:

a controlled frequency oscillator and a locking circuit operative to synchronize the frequency of the oscillator with the frequency of an incoming signal to the terminal, the oscillator and the locking circuit being constituted by a phase-locked loop, and reconfiguration control means operative to monitor the incoming signals to the terminal and to connect the locking circuit to any one of the incoming signals, the terminals being interconnected such that each is linked to the output of at least one of the other terminals in the network to receive output signals from the respective oscillators in those terminals;

characterized in that:

each phase lock loop includes a controlled delay element between the output of its oscillator and the input of its phase comparator, the delay caused by the delay element being controlled by the signal that controls the oscillator so that when the oscillator is made to increase in frequency the delay is made to decrease, and when the oscillator is made to decrease in frequency the delay is made to increase, and the reconfiguration control means connects the phase lock loop to any one of the incoming signals, if any are present and reconnects the locking circuit if the local oscillator fails to lock to the incoming signal initially chosen, the output from each oscillator being continuously transmitted on its outgoing links, so that the plurality of terminals tend toward stable synchronization provided that a forward path exists directly or indirectly from any one terminal to the remainder.

According to the present invention in a third aspect there is provided: a phase-locked loop including a variable delay element from the output of its oscillator to the input of its phase comparator, the delay caused by the delay element being controlled by the signal that controls the oscillator so that when the oscillator is made to increase in frequency the delay is made to decrease and when the oscillator is made to decrease in frequency the delay is made to increase.

Embodiments of the invention will now be described, by way of example only, with reference to the accompanying drawings.

In the drawings:

FIGS. 2(a) to (n) are diagrams of the three terminal system illustrating various fault conditions.

Figure 3:
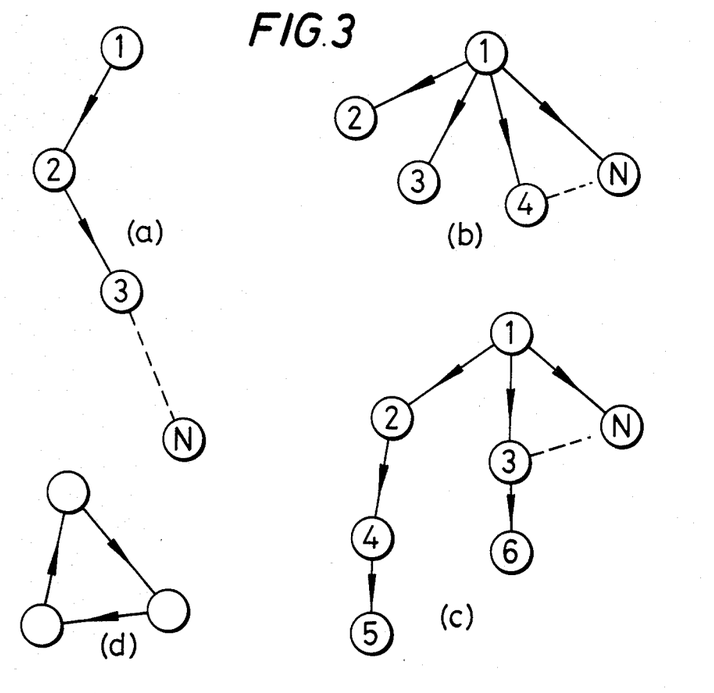
FIGS. 3(a) to (d) are schematic diagrams of possible fault conditions in which synchronization is nevertheless possible in a first embodiment of the invention.
Figure 4:
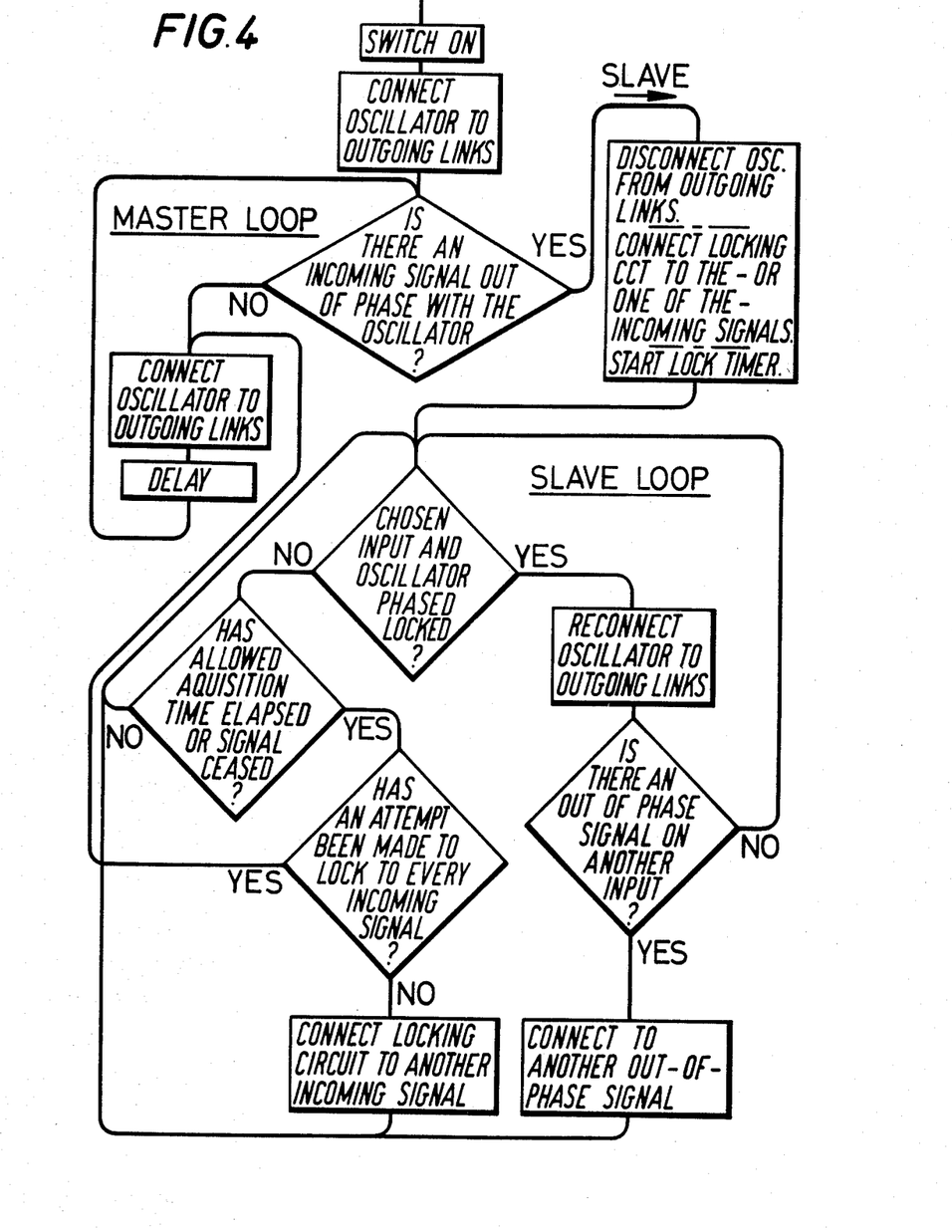
FIG. 4 is a flow diagram of an algorithm controlling terminal reconfiguration in the first embodiment of the invention.

Referring to FIGS. 3 and 4, N remote or co-located terminals are synchronized using a maximum of $N(N-1)$ inter-connecting links. As was also the case in the system described with reference to FIGS. 1 and 2 one terminal is maintained as master and the others as slaves; the master not being predetermined. In this embodiment of the invention, unlike the system in FIGS. 1 and 2, the system will remain synchronized provided that there remains a forward path directly or indirectly from one terminal to the remainder. FIGS. 3(a) to (d) show possible configurations in which synchronization is maintained and in the case of (a), (c) and (d) these configurations would not be possible in the known system illustrated in FIGS. 1 and 2. Of the configurations shown in FIG. 2 only in (n) would synchronization be lost. The reconfiguration algorithm used in this embodiment of the invention is illustrated, for example, by what happens when the fault conditions are such that one or more terminals become isolated from the only possible master as shown in FIG. 3(c) or the available terminals form a 'daisy chain' of two or more paths as shown in FIGS. 3(a) and (c). It then becomes necessary for terminals that become locked to retransmit the signal on their outgoing links. This causes problems when only sufficient paths are available for two or more terminals to lock together in a loop. In FIG. 3(d) if the terminals were each to attempt to lock to an incoming signal and simultaneously transmit on the outgoing link no one terminal would then be the master and the arrangement would drift to an extreme of its frequency (for reasons that will be clear from the description of the constructions of the terminals, to follow) resulting in jitter and possible loss of lock.

The method by which this embodiment of the invention overcomes this problem is as follows.

Immediately following switch-on a multi-stable condition exists in which each terminal transmits to the remaining N−1 terminals and simultaneously is prepared to disconnect its output signal when it recognizes a valid signal on its incoming links. The first N−1 terminals to disconnect their output become slaves and the remaining terminal becomes master. When this is accomplished the first stage in the method is complete.

In the second stage the slave terminals attempt to lock to the master signal. If and when they become locked they once again transmit their output signals to the other terminals. If the paths to the other terminals are intact then each output signal is received by the other slaves. However, the other slaves should already be locked to the master terminal or be in the process of locking to it, and the retransmission of an identical signal by the other slaves is ignored. Eventually, if there are no faults then all the slaves will lock to the master and retransmit the signal on their outgoing links so that each slave has N−1 identical signals at its input. The master terminal, which initially was transmitting because it had no incoming signals, now receives the return signals from the slaves. The terminals are, however, programmed to recognize and ignore signals that are synchronized to their own output and hence the master terminal will then not attempt to lock to the returning signals and the arrangement will remain stable.

FIG. 4 shows an example of a reconfiguration algorithm that can be used (for example, in a conventional control microprocessor) to effect this method.

The behavior of the system when fault conditions are present will now be considered. If one of the terminals that initially is a slave fails to lock (or loses its locking condition) then if it subsequently fails to lock to the retransmitted signal from the other slaves it will transmit its own signal to all the other terminals, including the master. The master terminal will recognize an out-of-phase incoming signal and subsequently disconnect its own output and attempt to lock to the new incoming signal. The other slaves upon losing the signal from their master will change over to the new master signal being transmitted by the faulty slave.

Similarly the system will adapt to other failure combinations including the loop structure shown in FIG. 3(d) in which the terminal following the first one to disconnect its output becomes the master. Evan a daisy chain of paths is sufficient with a terminal at the top of the chain becoming master and the signal being restransmitted down the chain as the slaves lock. Thus this system can be characterized by the fact that as long as a forward path remains, directly or indirectly from one terminal to the remainder, the terminals will synchronize.

Figure 5:
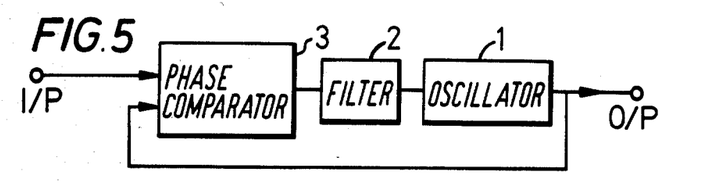
FIG. 5 is a block diagram of a phase-locked loop.

In the foregoing, the description of an embodiment of the invention has referred to the units in which the oscillators are contained as terminals, which have been considered as black boxes. In a second embodiment of the invention, the internal structure of the terminals must be considered. The terminals in the second embodiment of the invention comprise phase-locked loops and these may also partly constitute the terminals in the above-described first embodiment of the invention. Referring to FIG. 5, in its basic form a phase-locked loop comprises an oscillator 1, the output frequency of which can be controlled by an input signal (usually a voltage). Variation in the input signal causes variation in the output frequency of the oscillator. Also included is a filter 2, the reason for which need not be considered here. The last of the three basic elements is a comparator 3 which produces an output signal proportional to the phase difference between the input signals constituted by the input signal to the device as a whole and a feedback signal from the output of the oscillator 1.

In essence of phase-locked loop is a second order feedback device where any difference in phase between the two input signals to the phase comparator 3 produces an error signal which alters the frequency of the oscillator 1 in a direction that reduces the phase difference. In steady conditions with a constant frequency input the input signals to the phase comparator will be in phase.

Figure 6:
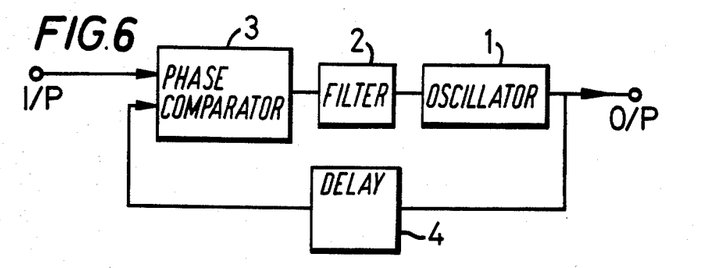
FIG. 6 is a block diagram of a phase-locked loop with feedback delay.

Referring to FIG. 6, if a delay element 4 is introduced into the feedback path then when the system has settled there will still be no phase error between the two inputs to the phase comparator. The output of the oscillator 1 will, however, be phase advanced from the input to the comparator by the delay caused by the element 4 in the feedback path. Use of this principle will now be described in a system which compensates for unwanted delay in the input path. If the unwanted delay is $\Delta t_1$ then the output of the phase-locked loop is compensated if the delay element in the feedback path presents a delay $\Delta t_2$ which is equal to $\Delta t_1$.

Figure 7:
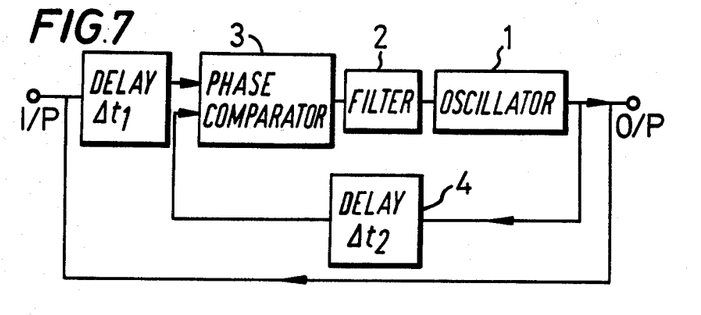
FIG. 7 is a block diagram of a phase-locked loop with input delay and feedback delay.

Referring now to FIG. 7; the circuit shown includes a connection from the output terminal of the oscillator 1 back to the input side of the element which introduces the unwanted delay $\Delta t_1$. It is not possible for the two delays $\Delta t_1$ and $\Delta t_2$ to be exactly equal and since the input signals to the circuit element which cause these delays come from exactly the same source there will inevitably always be a small phase delay between the input signals to the phase comparator 3. The comparator will unsuccessfully attempt to alter the frequency of the oscillator 1 to reduce this differential, and the oscillator 1 will drift to an extreme of its range.

The direction of the drift and therefore to which extreme the oscillator drifts depends on whether $\Delta t_1$ is greater than $\Delta t_2$ or vice versa. Thus if $\Delta t_2$ is greater than $\Delta t_1$ then the comparator 3 will continuously attempt to increase the frequency of the oscillator 1 in a vain effort to correct the error.

Figure 8:
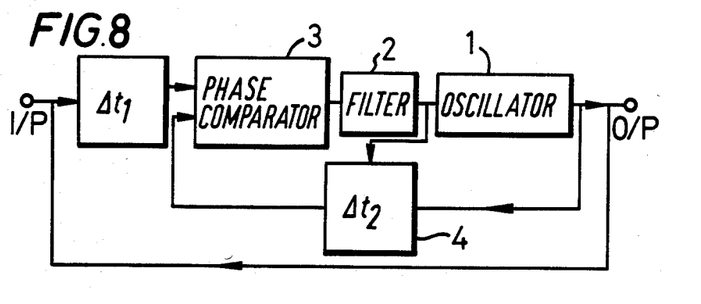
FIG. 8 is a block diagram of a circuit similar to that shown in FIG. 7, but including variable feedback delay.

Referring now to FIG. 8 the delay element 4 is variable with one that is supplied with, and controlled by, the signal from the comparator 3 so that the delay $\Delta t_2$ decreases as the oscillator frequency increases. As the comparator 3 increases the oscillator frequency to correct the disparity at its input, $\Delta t_2$ is decreased until $\Delta t_2$ becomes equal to $\Delta t_1$. Any further increase in the frequency of the oscillator will create an error in the opposite direction and the comparator will then reduce the frequency of the oscillator. Thus the arrangement shown in FIG. 8 can be made to stabilize with $\Delta t_1$ equal to $\Delta t_2$.

Figure 9:
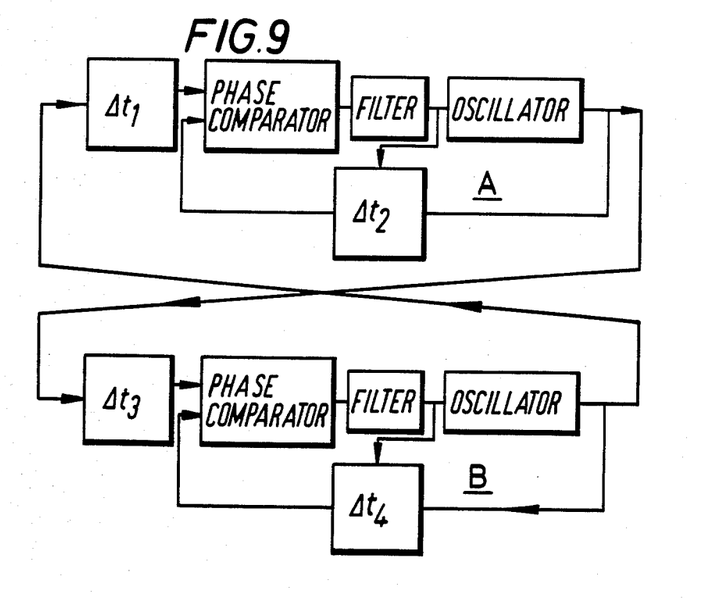
FIG. 9 is a block circuit diagram of two interconnected phase-locked loops.

Referring now to FIG. 9 this diagram shows two phase-lock loops of the kind shown in FIG. 8, each including input circuitry which gives an unwanted delay $\Delta t_1$ and $\Delta t_3$ respectively. Unlike the circuit in FIG. 11, the output of each phase-lock loop is connected to the input circuitry of the other. Designating the upper phase-lock loop as A and the lower as B, and defining the particular instance of the input signal to the circuit B as a reference time T then the output of the input circuitry to circuit B will be $T+\Delta t_3$. Assuming that the system is stable then the other input to the comparator 3 in the circuit B will be exactly in phase with the input from its input circuitry i.e. also timed at $T+\Delta t_3$. Since the other input to the phase comparator of circuit B comes from its delay element 4 which gives a delay $\Delta t_4$ then the input to this delay element i.e. the output of the oscillator 1 of the circuit B must be timed at $T+\Delta t_3-\Delta t_4$. The output of the oscillator 1 in circuit B is the input to the input circuitry of the circuit A. If the same reasoning is applied, the output of the oscillator 1 in circuit A must be $T+(\Delta t_1-\Delta t_2)+(\Delta t_3-\Delta t_4)$. But, this is also the input to the input circuitry of circuit B which we defined as being timed at time T. Thus, $$T = T + (\Delta t_1 - \Delta t_2) + (\Delta t_3 - \Delta t_4)$$

$$(\Delta t_1 - \Delta t_2) = -(\Delta t_3 - \Delta t_4)$$

Figure 10:
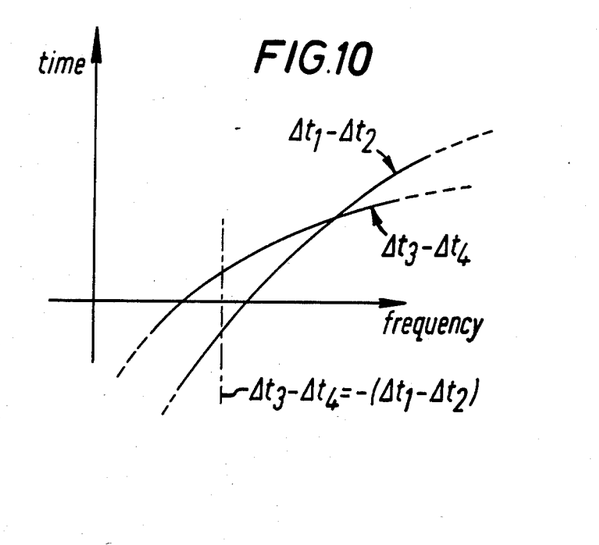
FIG. 10 is a graph showing frequency plotted against time, and illustrating compatible delay conditions for the circuit of FIG. 9.

The further condition for stability of the circuit is that the two oscillators in the circuits A and B must give outputs of identical frequency. Since $\Delta t_2$ and $\Delta t_4$ are functions of frequency, then the frequency at which $\Delta t_1 - \Delta t_2$ equals $\Delta t_4 - \Delta t_3$ is the stable frequency. An analytic solution is possible for illustration. FIG. 10 shows a possible graph of the values of $\Delta t_1 - \Delta t_2$ and $\Delta t_3 - \Delta t_4$ at varying frequencies. Ideally, $\Delta t_3 - \Delta t_4$ and $\Delta t_1 - \Delta t_2$ should be close to zero at the stable frequency since this would minimize the phase error between the outputs of the oscillators in each circuit. It would also be ideal for the two curves of the graph to coincide.

Figure 11:
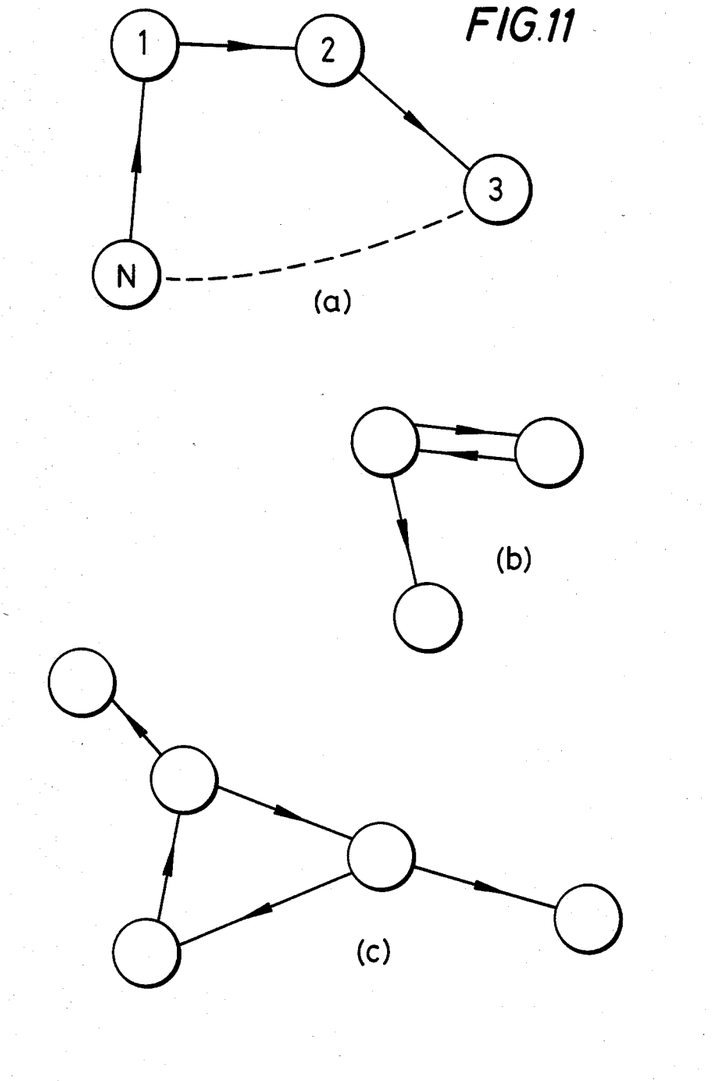
FIG. 11 is a schematic diagram of surmountable fault conditions in a second embodiment of the invention.

The arrangement of two phase-lock loops as described may be extended to a full system including N phase-locked loops. Some examples of connections where synchronization is possible are shown in FIG. 11. The loops need not be connected as a ring but may for example have two linked in a ring and one in a spur, or other combinations. Despite all the possible combinations of rings and spurs the phase delays between the oscillator outputs of the phase-locked loops will still be minimal. This is because on the spur terminals the feedback delay will compensate for the input delay. In the full synchronization system each phase-locked loop has connections giving it a choice of input signals from each of the other N-1 terminals and each includes a reconfiguration unit to control the choice. The system overall has a similar fault tolerance characteristic to the system described as the first embodiment of the invention with reference to FIGS. 3 and 4 i.e. all oscillators are kept in synchronization provided that there remains a path either directly or indirectly from any one phase-locked loop to the other N-1.

Figure 12:
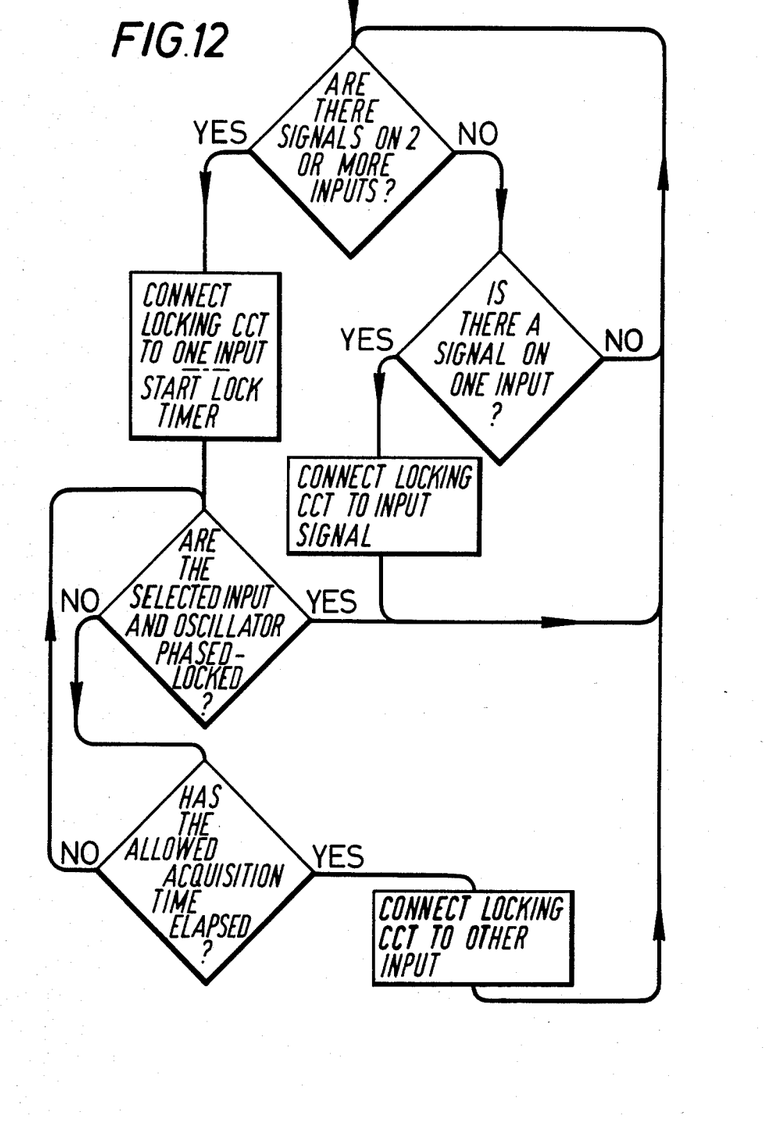
FIG. 12 is a flow diagram of an algorithm controlling terminal reconfiguration in the second embodiment of the invention.

FIG. 12 shows a flow chart for a possible algorithm for the reconfiguration procedure in this embodiment of the invention. This arrangement offers the advantage over the first embodiment described above in that the output from each oscillator is connected continuously to the other terminals.

I claim:

1. A network of at least three terminals each being interconnected to the others by respectively associated incoming and outgoing signal links therebetween, each terminal comprising:

a controlled-frequency oscillator having a control input connection and an output, a locking circuit means having an output coupled to said control input connection of the oscillator to synchronize the frequency of the oscillator with the frequency of an incoming signal to the terminal when coupled to a central input of the locking circuit, and reconfiguration control means operative to monitor a plurality of incoming signals to the terminal on said incoming links thereto and to connect the control input of the locking circuit to any one of said incoming signal links, and to connect or disconnect the local oscillator output to or from the outgoing links from the terminal;

the terminals being interconnected such that each is linked via its respective incoming signal links to an output link of at least one of the other terminals in the network to receive output signals from the respective oscillator in those other terminals;

characterized in that:

the reconfiguration control means in each terminal monitors the received incoming signals on said incoming links and compares the phase of each with that of its own corresponding oscillator output, when said comparison detects an out-of-phase incoming signal the reconfiguration control means disconnects its own oscillator output from its own outgoing links and connects the locking circuit control input to one of the incoming signals, when said comparison does not detect an out-of-phase incoming signal the reconfiguration control means connects its own oscillator output to its own outgoing links, the reconfiguration control means is further operative to detect whether its oscillator has locked or remains locked to an incoming signal to which it has been connected, and (i) if so, to connect its oscillator output to its outgoing links, and if there remains another out-of-phase incoming signal, to connect its locking circuit control input to said another out-of-phase incoming signal, (ii) if it has not locked, to connect its locking circuit control input to any other one of the incoming signal links for which lock has not yet been attempted, until all incoming signal links have been connected without locking, and then to reconnect its own oscillator output to its own outgoing links, so that the plurality of terminals tend towards stable synchronization provided that a forward path exists directly or indirectly from any one terminal, which then becomes the master, to the remaining terminals, which become the slaves.

2. A network of at least three terminals each being interconnected to the others by respectively associated incoming and outgoing signal links therebetween, each terminal comprising:

a controlled frequency oscillator having a control input and a signal output;

a locking circuit having a control input and an output coupled to the control input of the oscillator and operative to synchronize the frequency of the oscillator with the frequency of an incoming signal to the terminal when coupled to the control input of the locking circuit, the oscillator and the locking circuit including a phase-locked loop having a phase comparator with inputs coupled to the oscillator output and to said locking circuit control input and having a phase comparator output coupled to the control input of said oscillator, and reconfiguration control means operative to monitor the incoming signal links to the terminal and to connect the locking circuit control input to any one of the incoming signal links, the terminals being interconnected such that each is linked via its respective incoming signal links to an output link of at least one of the other terminals in the network to receive output signals from the respective oscillator in those terminals;

characterized in that:

each phase locked loop includes a controlled delay element between the output of its oscillator and the input of its phase comparator, the delay caused by the delay element being controlled by the locking circuit output that also controls its respective oscillator so that when the oscillator is made to increase in frequency the delay is made to decrease, and when the oscillator is made to decrease in frequency the delay is made to increase, and the reconfiguration control means connects the locking circuit control input to any one of the incoming signal links, if any incoming signals are present, and reconnects the locking circuit control input if its respective oscillator fails to lock the incoming signal intitially chosen, the output from each oscillator being continuously transmitted on its outgoing links so that the plurality of terminals tend toward stable synchronization provided that a forward path exists directly or indirectly from any one terminal to the remainder of the terminals.

3. A phase-locked loop having (a) a phase comparator with a first input for receiving an externally supplied periodic reference signal, a second input for receiving a periodic feedback signal and an output supplying a signal corresponding to the phase difference between the reference and feedback signals supplied to its inputs and (b) a variable frequency oscillator having an output connected to supply said periodic feedback signal and being controlled in its frequency of operation by the output of said phase comparator, said phase locked loop also including (c) a variable delay element connected from the output of its oscillator to the second input of its phase comparator, the delay element also being controlled by the same phase comparator output signal that controls the oscillator so that when the oscillator is made to increase in frequency the delay is made to decrease and when the oscillator is made to decrease in frequency the delay is made to increase.

4. A plurality of phase-locked loops as claimed in claim 3 wherein the output of each oscillator is connected as the externally supplied periodic reference signal input of the phase comparator in another one of the phase-locked loops.

5. An interactive non-hierarchical method for synchronizing a network of plural oscillators each having a signal output which is linked to all other oscillator sites by respectively associated outcoming signal links therefrom which become incoming signal links at the recipient oscillator site, each oscillator also having a phase-locking input port, said method comprising performance of the following steps at each local oscillator site:

monitoring the incoming signal links and comparing the incoming signal phase on each incoming link with the output signal phase of the local oscillator;

disconnecting said local oscillator output from its associated outgoing signal links and connecting one of the incoming signal links to the phase-locking input of the local oscillator when an out-of-phase incoming signal is detected in said monitoring step;

connecting said local oscillator output to its associated outgoing signal links when no out-of-phase incoming signal is detected in said monitoring step; and detecting whether the local oscillator has locked or remains locked to an incoming signal in the event its phase-locking input has been connected thereto and (i) if so, reconnecting the local oscillator output to its associated outgoing signal links, again monitoring the relative phase of the incoming signals and, if there remains another out-of-phase incoming signal, connecting its phase-locking input to another out-of-phase incoming signal and then again performing said detecting step; and (ii) if not, to connect the phase-locking input of the local oscillator to another different one of the incoming signal links and to repeat said detecting step until all incoming signals have been connected to the phase-locking input without actually phase locking thereto whereupon the local oscillator output is reconnected to its associated outgoing links and said monitoring step is again performed, wherein said network of oscillators tend toward stable mutual synchronization provided that a forward path exists directly or indirectly via said links from any one oscillator site, which then becomes a master phase source, to the remaining oscillators, which then become phase slaved to the master phase source.

6. An interactive non-hierarchical method for synchronizing a network of plural PLL oscillator each having a signal output which is linked to all other PLL oscillator sites by respectively associated outgoing signal links therefrom which become incoming signal links at the recipient PLL oscillator site, each PLL oscillator also having a phase-locking input port and being capable of maintaining a stable frequency of operation even in the absence of an input control signal thereto, said method comprising the performance of the following steps at each local PLL oscillator site:

monitoring for the presence of signals on the incoming links and connecting said phase-locking input to one of the present incoming signals;

detecting whether the local PLL oscillator has locked or remains locked to an incoming signal in the event its phase-locking input has been connected thereto and, if not, reconnecting the phase-locking input to one of the present incoming signals and then repeating said detecting step whereby the network of PLL oscillators tends toward stable synchronization provided that a forward path exists directly or indirectly via said links from any one PLL oscillator site, which then becomes a master phase source, to the remaining PLL oscillators, which then become phase slaved to the master phase source.

7. An interactive non-hierarchical method as in claim 6 wherein, in each PLL oscillator, a feedback signal from a controlled-frequency oscillator output to one of two phase comparator inputs is variably time delayed in controlled response to the phase comparator output which is also used to control the oscillator frequency such that said time delay increases when the oscillator frequency is caused to decrease and vice versa whereby the PLL oscillator exhibits a stable frequency of oscillation even in the absence of any signal on any incoming link being connected to the other input of said phase comparator which other input acts as said phase-locking input of the PLL oscillator.

8. A method of synchronizing oscillators in a network of at least three interconnected terminals, each having incoming signal links coming from other terminals and outgoing signal links going to other terminals and each terminal comprising (a) a controlled-frequency oscillator having a control input and a signal output; (b) a locking circuit having an output connected to the control input of the oscillator and also having a control input and being operative to synchronize the frequency of the oscillator signal output with the frequency of a signal on an incoming signal link to the terminal when connected to its control input, and (c) reconfiguration control means operative to monitor signals on the incoming links to the terminal and to connect the locking circuit control input to any one of the incoming signal links, and to connect or disconnect the local oscillator signal output to or from the outgoing links from the terminal; said method comprising performance of the following steps being at each terminal:

monitoring the received signals on the incoming links in each terminal and comparing the phase of each with that of its own corresponding oscillator signal output, when said comparison detects an out-of-phase incoming signal, disconnecting its oscillator from its outgoing links and connecting the locking circuit control input to one of the incoming signals, when said comparison does not detect an out-of-phase incoming signal, connecting its oscillator signal output to its outgoing links, detecting whether its oscillator has locked or remains locked to an incoming signal to which its locking circuit has been connected, and (i) if so, to connect the oscillator output to its outgoing links, and if there remains another out-of-phase incoming signal, to connect its locking circuit control input to this other out-of-phase incoming signal, (ii) if it has not locked, to connect its locking circuit to any other incoming signal, until the locking circuit has been at least once connected to all the signals on the incoming links without locking, and then to reconnect its oscillator output to its outgoing links, so that the plurality of terminals tend towards stable synchronization provided that a forward path exists directly or indirectly from any one terminal, which then becomes the master, to the remaining terminals, which become the slaves.

9. A stabilized phase-locked loop comprising:
a controlled frequency oscillator,
a phase comparator connected to receive as inputs to be compared an output from the oscillator and a circuit input signal,
an output from the comparator being connected to provide a frequency control signal to the oscillator, and
a variable signal delay element connected in the path from the output of the oscillator to the input of the phase comparator, the delay element also being controlled by the frequency control signal to the oscillator in such a manner that a signal to the oscillator causing it to increase in frequency decreases the delay provided by the signal delay element, and a signal to the oscillator causing it to decrease in frequency increases the delay provided by the signal delay element, such that the phase-locked loop is enabled to stabilize in the absence of a circuit input signal to the phase comparator.

10. A plurality of phase-locked loops as claimed in claim 9 characterized in that the oscillator of each of said phase-locked loops is also connected to provide the circuit input signal to another one of the phase-locked loops thereby connecting all the phase-locked loops together in one continuous linked chain.

11. A network of at least three stabilized phase-locked loops as claimed in claim 9, each phase-locked loop being part of a terminal, and each terminal being interconnected to other terminals by having incoming links coming from other terminal oscillator outputs and by having outgoing links connecting its oscillator output to other terminals; each terminals further comprising:

reconfiguration control means operative to monitor signals on the incoming links to the terminal and to connect a control input of its phase-locked loop to any one of the incoming signal links and the reconfiguration control means also being operative to connect the control input of its phase-locked loop to any one of the incoming signal links, if any signals are present thereon, and to reconnect the phase-locked loop control input if its associated oscillator fails to lock to the incoming signal initially chosen, the output from its oscillator being continuously transmitted on the terminals outgoing links, so that the plurality of terminals tends toward stable synchronization provided that a forward path exists directly or indirectly from any one terminal to the other terminals.

* * * * *